(12) United States Patent
Nagai et al.

(10) Patent No.: US 8,337,032 B2
(45) Date of Patent: Dec. 25, 2012

(54) SEMICONDUCTOR LIGHT-EMITTING APPARATUS

(75) Inventors: Hideo Nagai, Osaka (JP); Yasuharu Ueno, Osaka (JP)

(73) Assignee: Panasonic Corporation, Osaka (JP)

( * ) Notice: Subject to any disclaimer, the term of this patent is extended or adjusted under 35 U.S.C. 154(b) by 287 days.

(21) Appl. No.: 12/867,216

(22) PCT Filed: Mar. 16, 2009

(86) PCT No.: PCT/JP2009/001154
§ 371 (c)(1),
(2), (4) Date: Aug. 11, 2010

(87) PCT Pub. No.: WO2009/119034
PCT Pub. Date: Oct. 1, 2009

(65) Prior Publication Data
US 2011/0090696 A1   Apr. 21, 2011

(30) Foreign Application Priority Data
Mar. 26, 2008   (JP) .................. 2008-080597

(51) Int. Cl.
*F21V 9/16*   (2006.01)

(52) U.S. Cl. ........................... 362/84; 362/230; 362/293

(58) Field of Classification Search .................. 362/84, 362/230, 231, 293, 551, 555; 313/502–504, 313/485; 359/634; 257/98
See application file for complete search history.

(56) References Cited

U.S. PATENT DOCUMENTS

| | | | |
|---|---|---|---|
| 7,045,375 B1 | 5/2006 | Wu et al. | |
| 7,286,296 B2 * | 10/2007 | Chaves et al. | 359/641 |
| 7,665,858 B2 * | 2/2010 | Falicoff et al. | 362/84 |
| 2003/0044645 A1 | 3/2003 | Kambe et al. | |
| 2005/0064241 A1 | 3/2005 | Kambe et al. | |
| 2006/0076571 A1 | 4/2006 | Hsieh et al. | |
| 2006/0258028 A1 | 11/2006 | Paolini et al. | |
| 2007/0126017 A1 | 6/2007 | Krames et al. | |
| 2008/0262316 A1 * | 10/2008 | Ajima et al. | 600/178 |
| 2009/0155943 A1 | 6/2009 | Krames et al. | |

FOREIGN PATENT DOCUMENTS

| | | |
|---|---|---|
| EP | 1 605 526 | 12/2005 |
| EP | 1 770 794 | 4/2007 |
| JP | 2003-347061 | 12/2003 |
| JP | 2005-268323 | 9/2005 |
| JP | 2006-049410 | 2/2006 |

(Continued)

OTHER PUBLICATIONS

Chinese Application No. 200980106419.2 Office Action dated Sep. 26, 2011, 4 pages.

*Primary Examiner* — Thomas Sember

(57) ABSTRACT

A blue LED 18 that is a semiconductor light-emitting device and that emits blue light as primary light having a peak wavelength in a visible region and a phosphor plate 30 that is a wavelength converter and that converts a portion of the blue light emitted from the blue LED 18 into yellow light as secondary light having a longer peak wavelength in the visible region than the peak wavelength and emits the yellow light in combination with a remainder of the blue light left unconverted. The phosphor plate 30 includes (a) a main body 39 extending across a light-emission path of the blue LED 18 and (b) a light-emitting part 42 composed of a plurality of columnar protrusions 44 on a part of the main body 39 in a direction in which the light exits.

20 Claims, 15 Drawing Sheets

FOREIGN PATENT DOCUMENTS

| | | |
|---|---|---|
| JP | 2007-150331 | 6/2007 |
| WO | 01/50500 | 7/2001 |
| WO | 2006/049533 | 5/2006 |
| WO | 2008/060586 | 5/2008 |
| WO | 2008/086855 | 7/2008 |
| WO | 2009/016585 | 2/2009 |

* cited by examiner

[Fig. 1A]
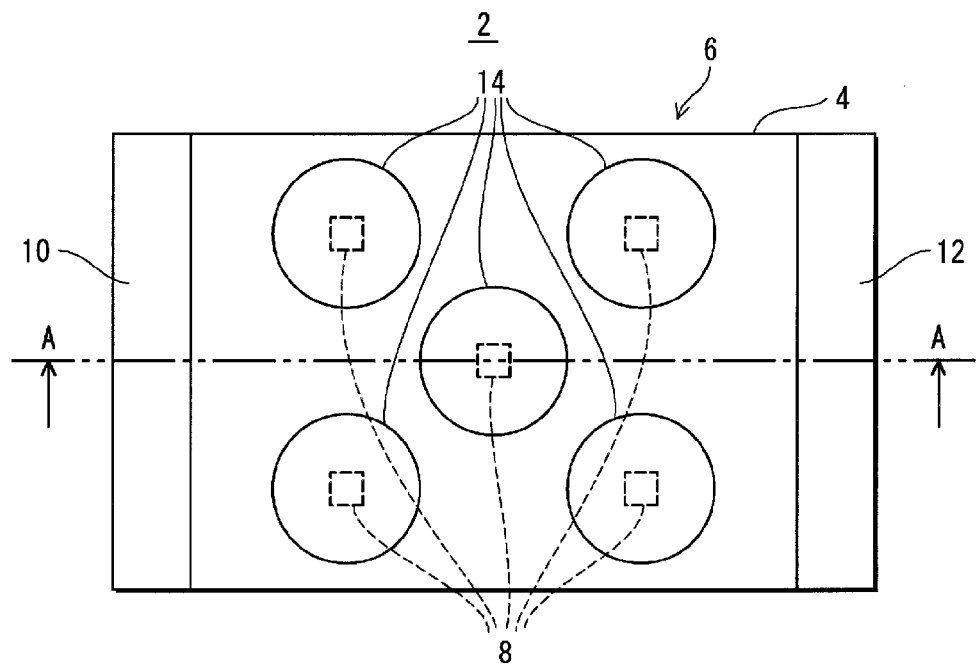
[Fig. 1B]
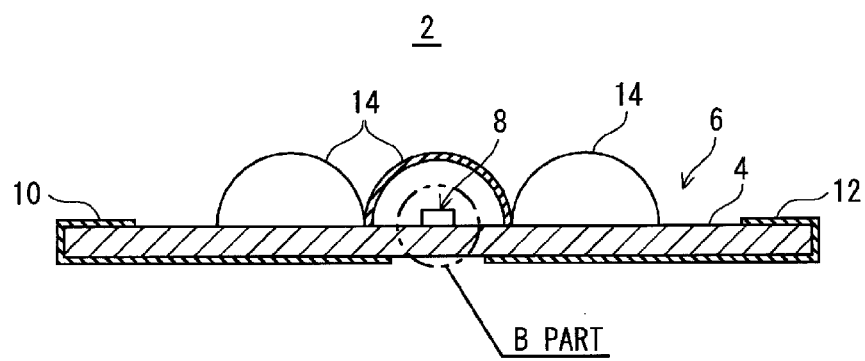

[Fig. 2A]
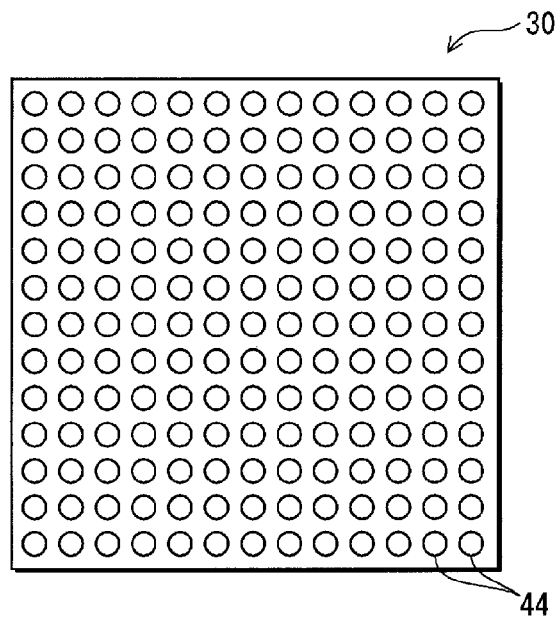
[Fig. 2B]
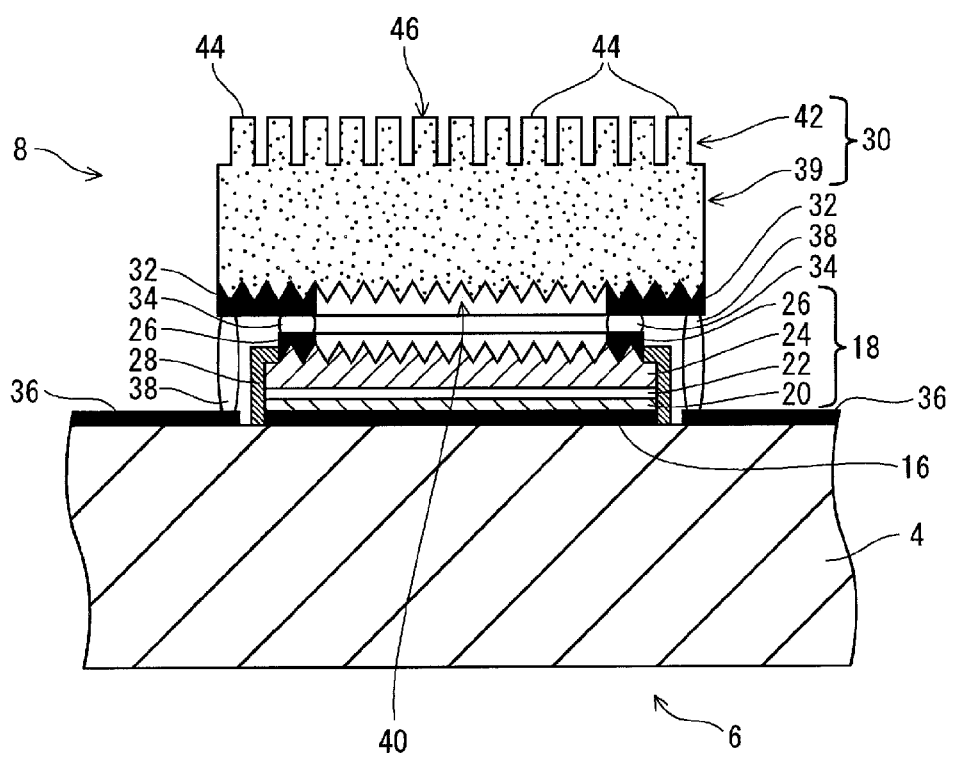

[Fig. 3A]
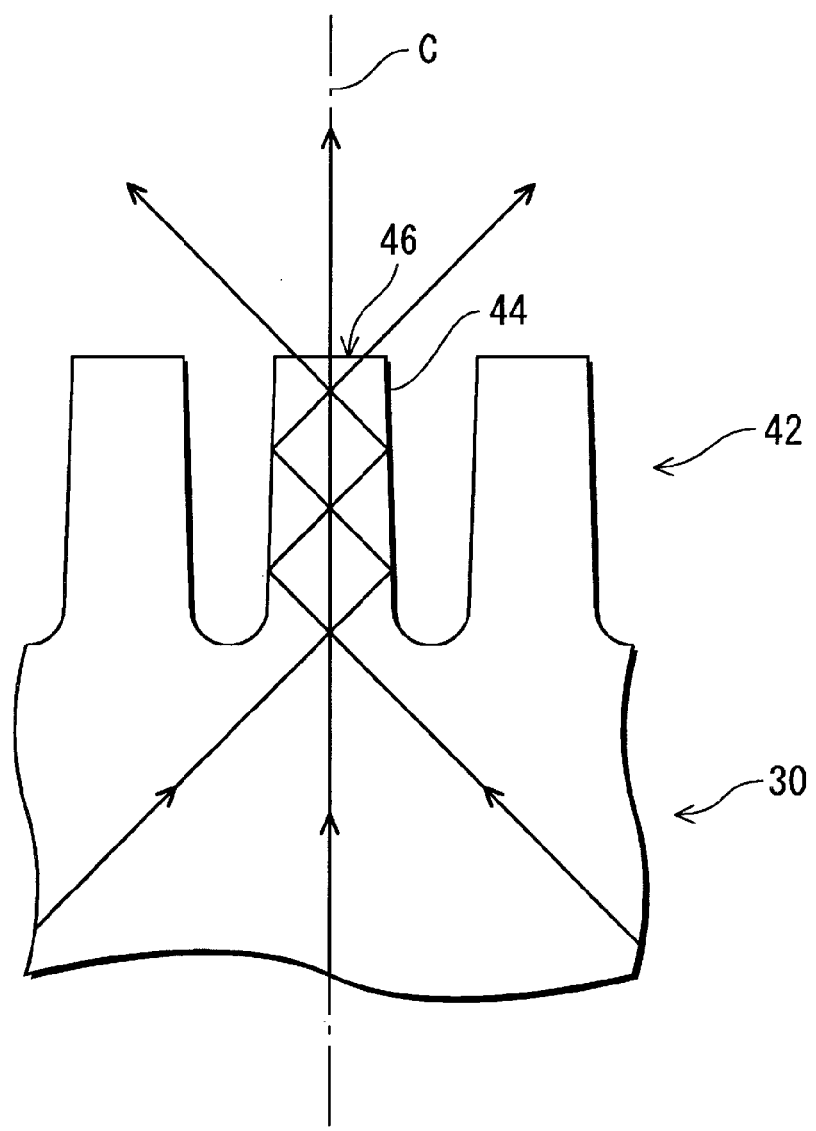

[Fig. 3B]
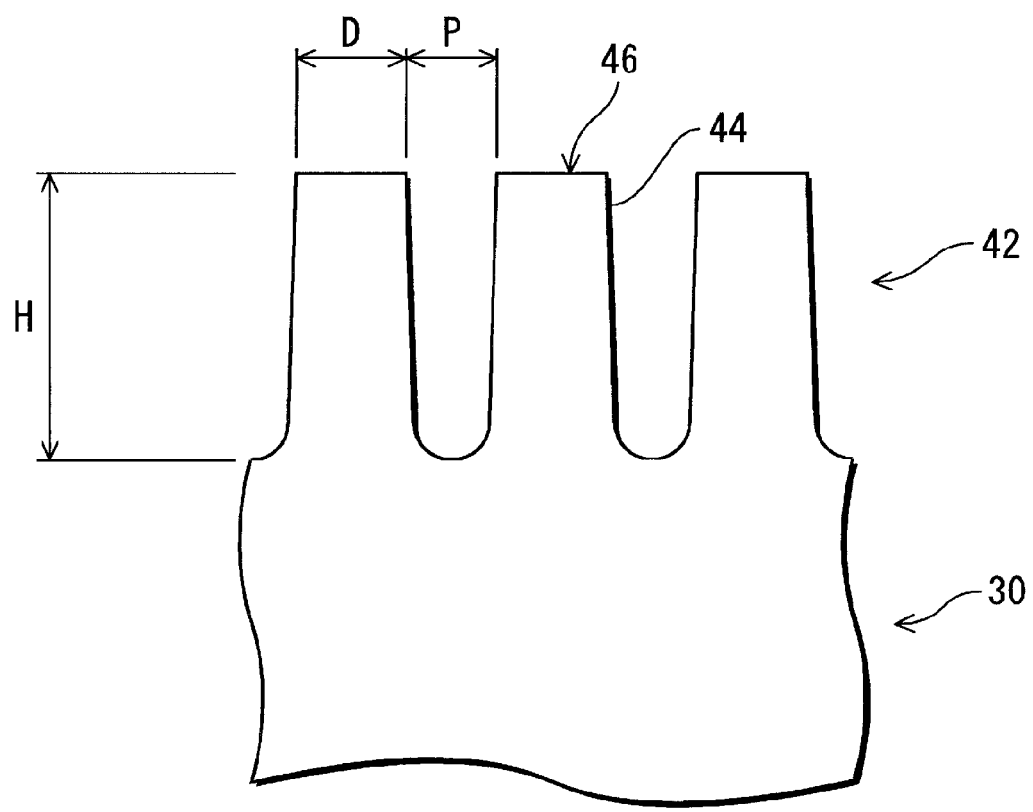

[Fig. 4]
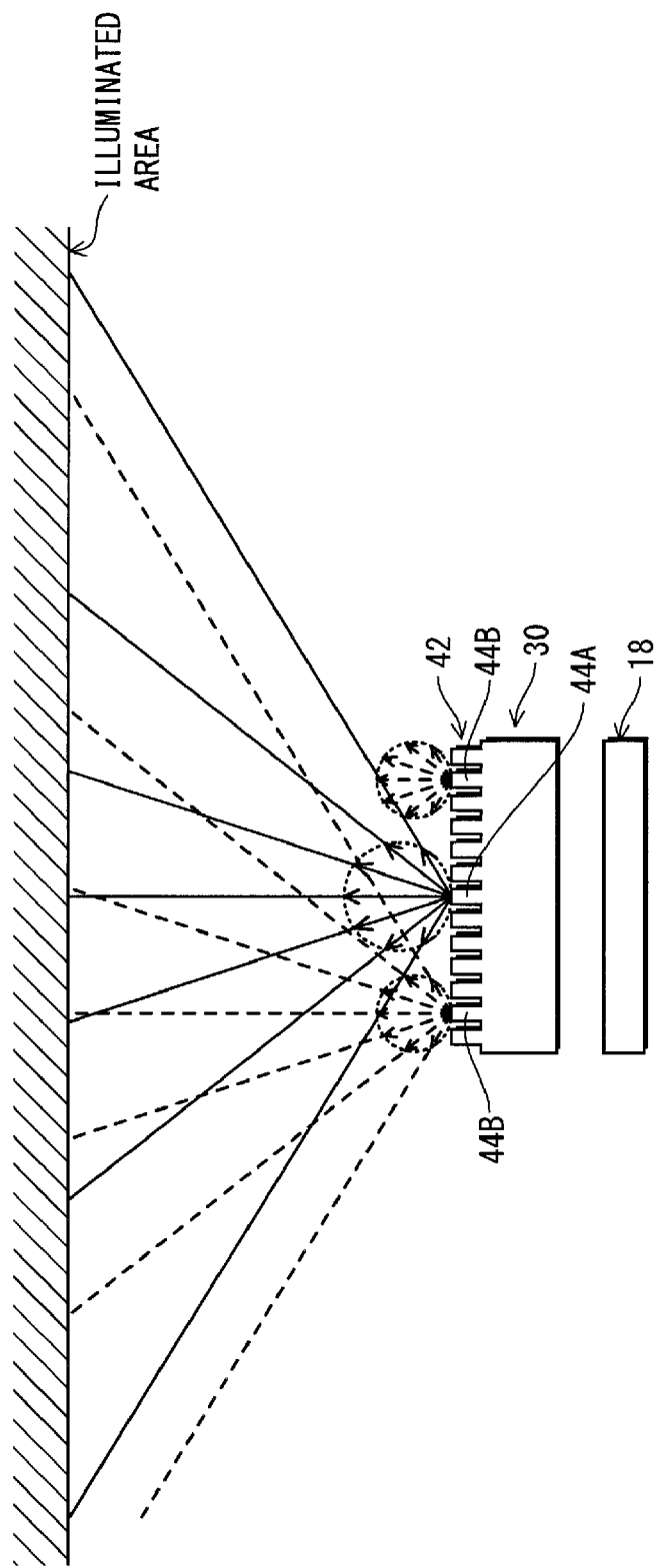

[Fig. 5]
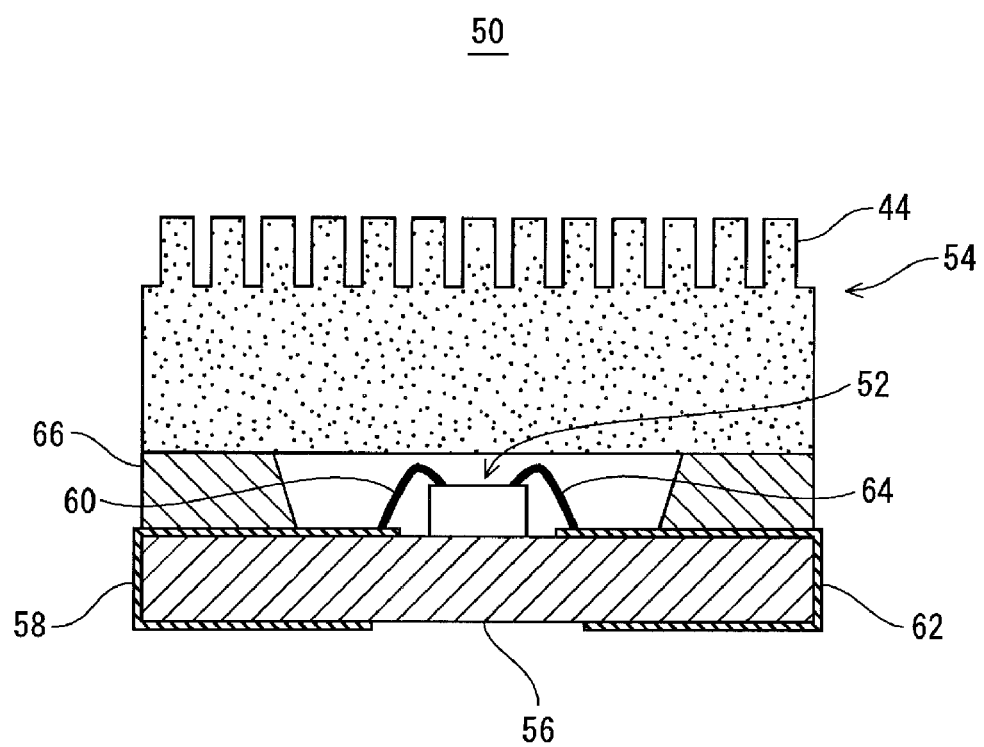

[Fig. 6]
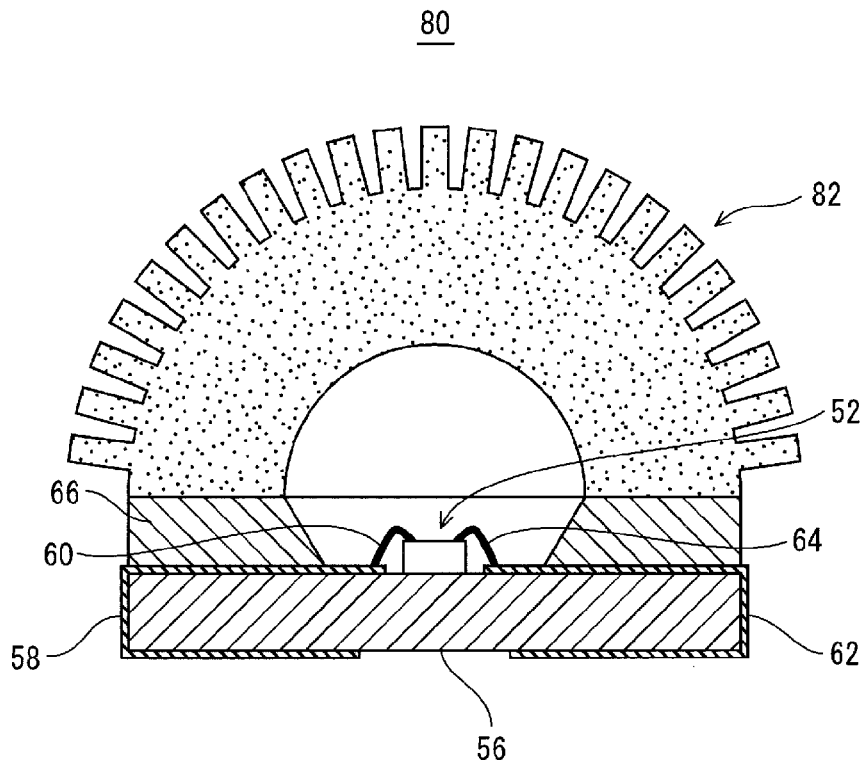
[Fig. 7]
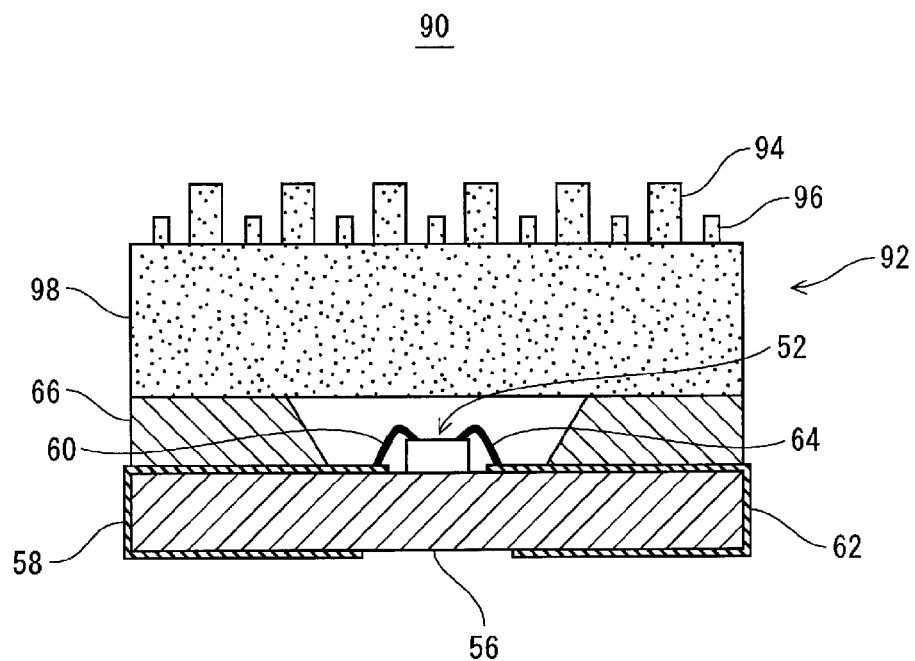

[Fig. 8A]
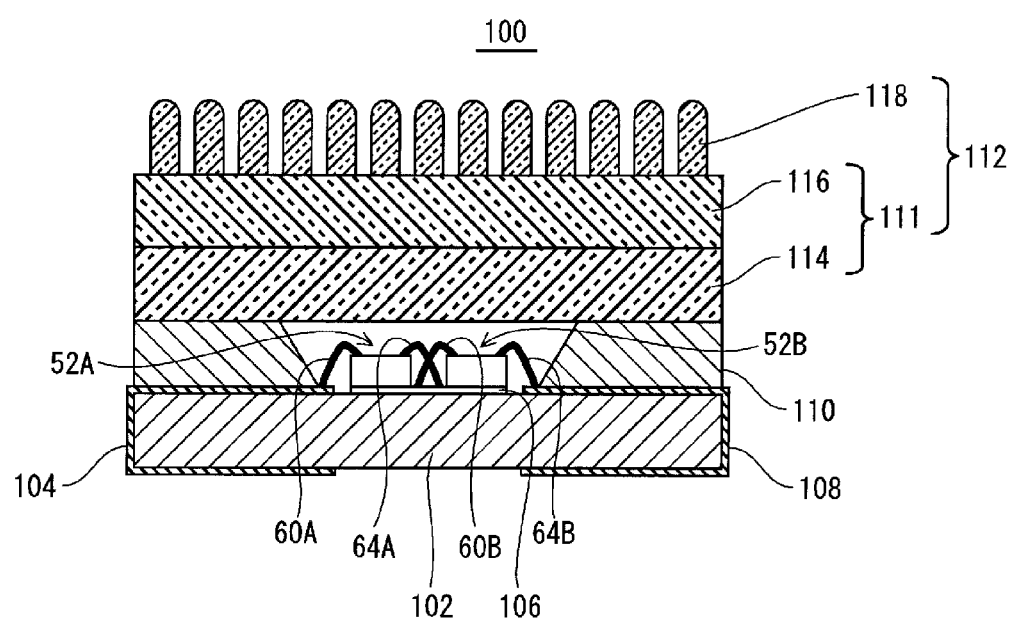

[Fig. 8B]
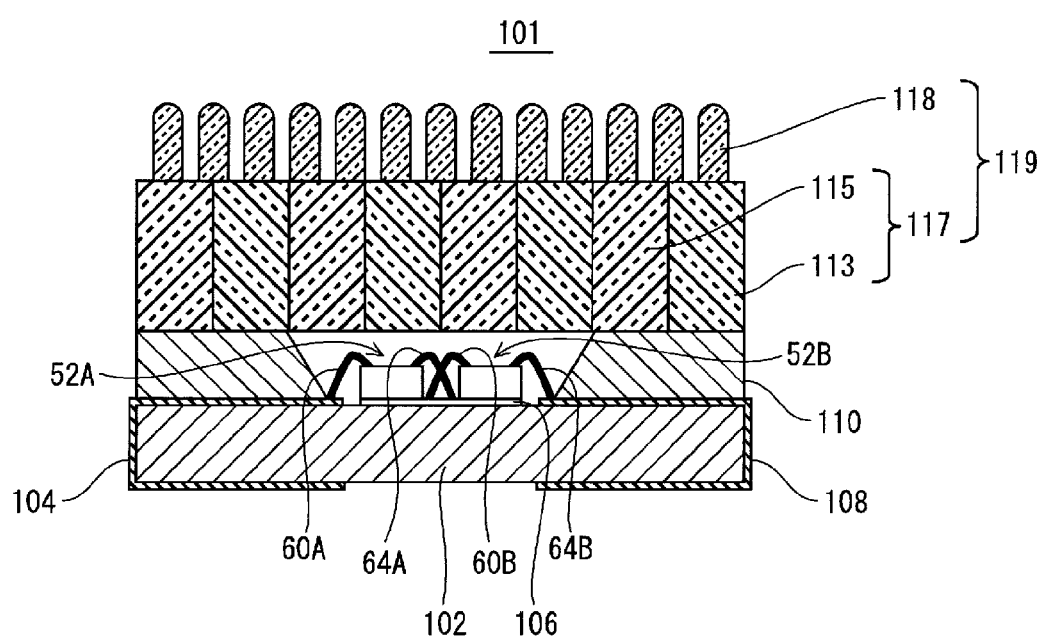

[Fig. 9]
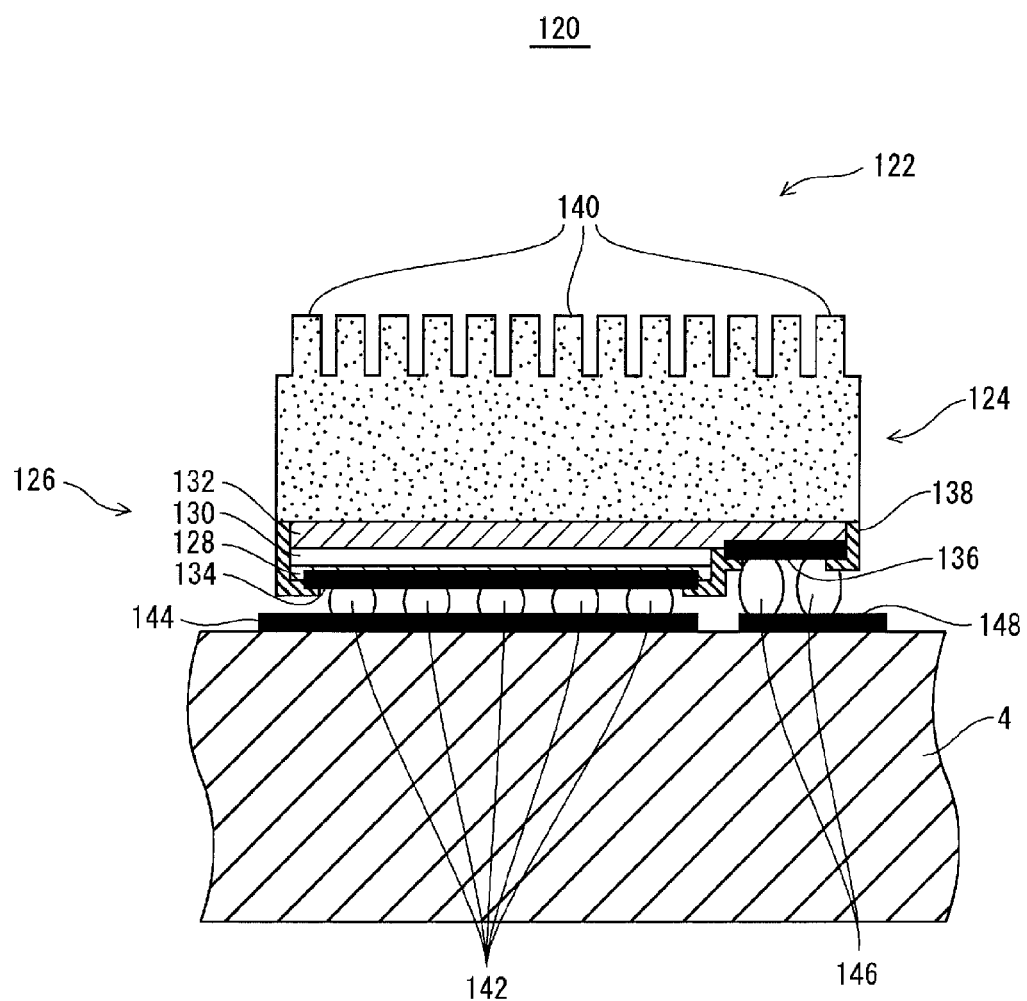

[Fig. 10A]
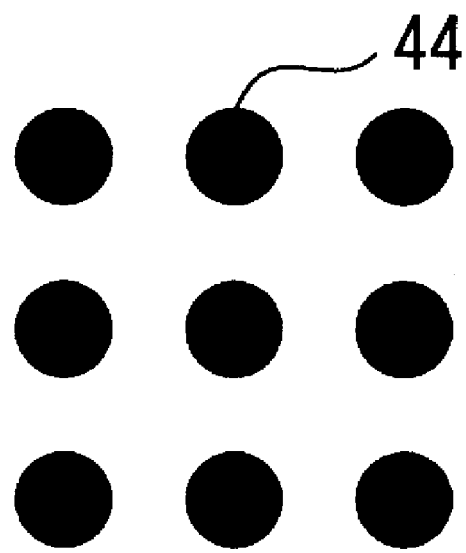
44
[Fig. 10B]
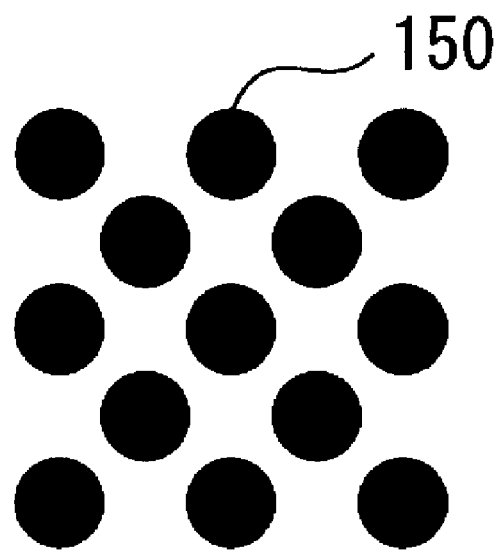
150

[Fig. 10C]
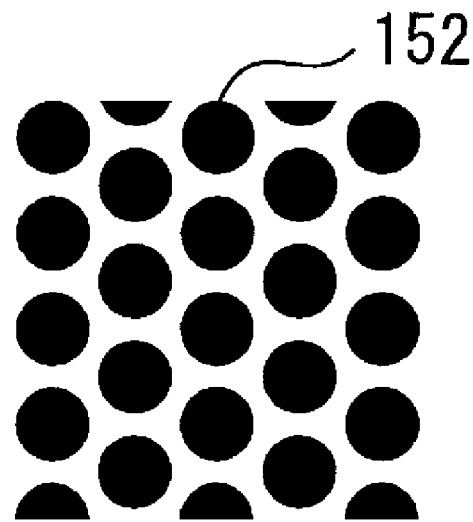
[Fig. 10D]
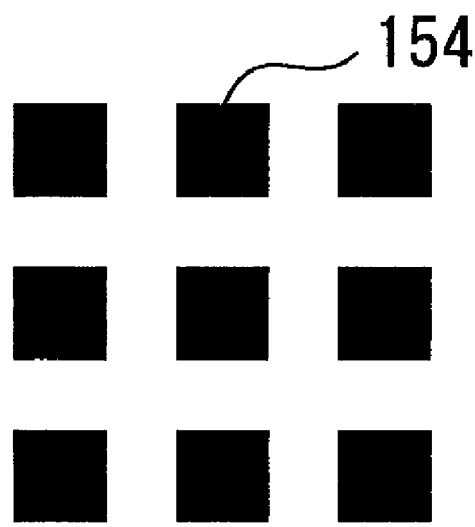

[Fig. 10E]
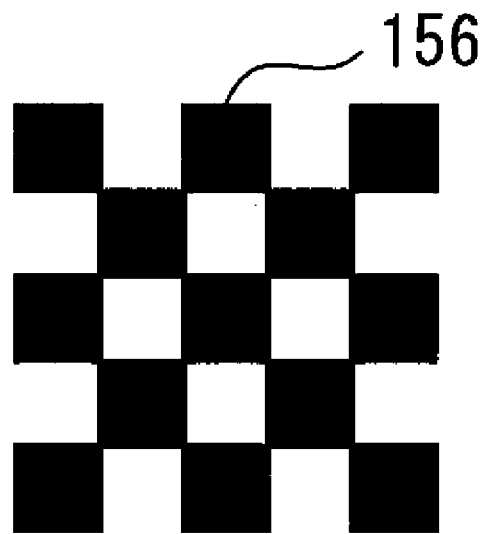
[Fig. 10F]
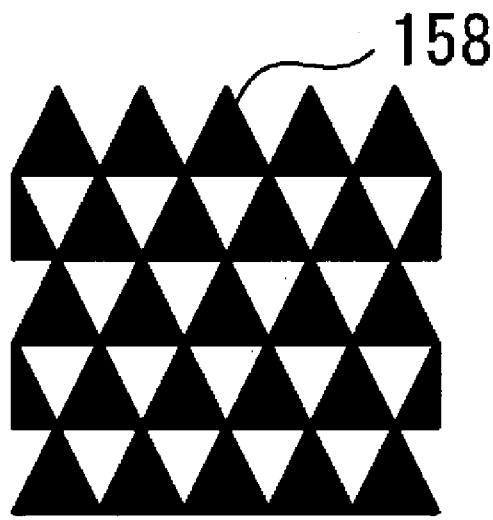

[Fig. 10G]
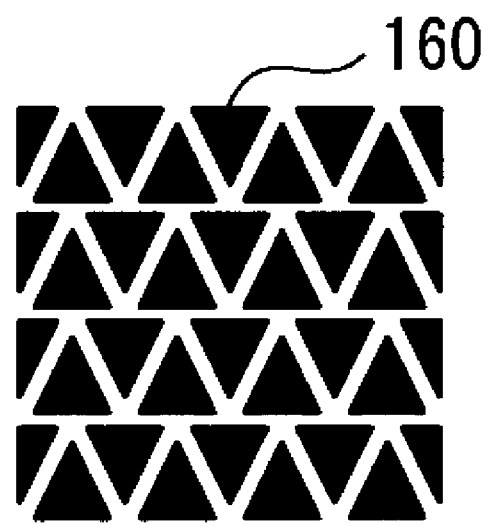
[Fig. 10H]
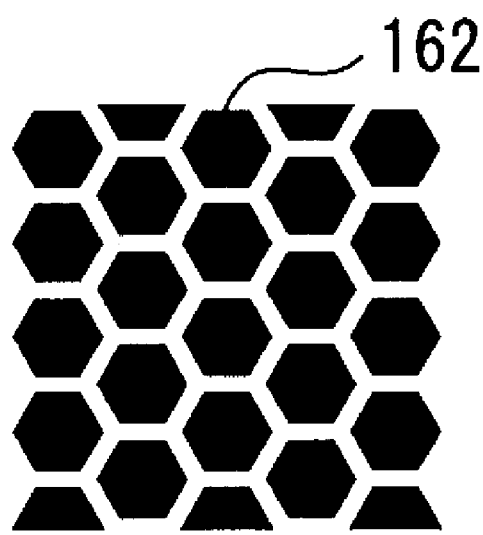

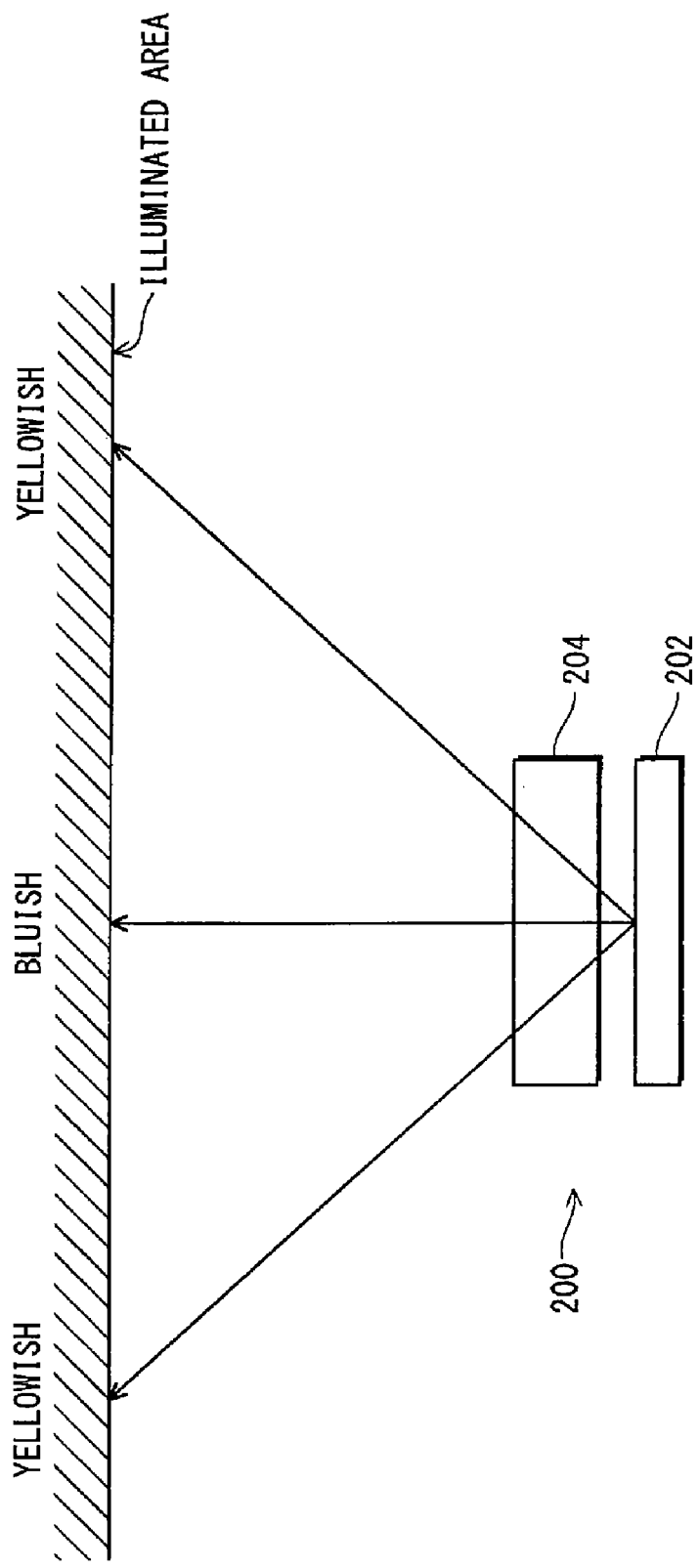

SEMICONDUCTOR LIGHT-EMITTING APPARATUS

TECHNICAL FIELD

The present invention relates to a semiconductor light-emitting apparatus, and in particular to a semiconductor light-emitting apparatus having a semiconductor light-emitting device and a wavelength converter that converts primary light emitted from the light-emitting device to secondary light having a wavelength different from that of the primary light.

BACKGROUND ART

In recent years, a white LED package that is one type of a semiconductor light-emitting apparatus is widely used as an alternative to a conventional lighting fixture, such as a fluorescent lamp. It is generally known that a white LED can be achieved by combining a blue LED which is one type of the semiconductor light-emitting device and a yellow phosphor which is a wavelength conversion material. The white LED generates white light as follows. The blue LED emits blue light (primary light) and the blue light excites a yellow phosphor to generate yellow light (secondary light). The blue light that does not excite the yellow phosphor is mixed with the yellow light so as to produce white light.

For example, Patent Citation 1 discloses an LED package having a blue LED chip and a phosphor plate made of a synthetic resin in which yellow phosphor particles are dispersed.

In addition, Patent Citations 2 and 3 each disclose a phosphor plate made of sintered light-emitting ceramics.
Patent Citation 1: Japanese Unexamined Patent Application Publication No. 2003-347061
Patent Citation 2: Japanese Unexamined Patent Application Publication No. 2006-49410
Patent Citation 3: Japanese Unexamined Patent Application Publication No. 2007-150331

DISCLOSURE OF INVENTION

Problems Solved by the Invention

However, according to the white LED package described in Patent Citation 1, unfortunately, the color is uneven in an illuminated area thereof. This problem is described with reference to FIG. 11.

FIG. 11 is a schematic diagram solely showing a blue LED chip 202 and a phosphor plate 204 of a conventional white LED package 200.

When blue light emitted from the blue LED chip 202 is passing through the phosphor plate 204, a wavelength of a portion of the blue light is converted to that of yellow light. In this instance, the longer distance in the phosphor plate 204 the blue light travels, the more blue light is converted into the yellow light. For that reason, more blue light that is obliquely incident upon the phosphor plate 204 is converted into the yellow light than the blue light that is vertically incident upon the phosphor plate 204.

As a result, the color in the illuminated area is uneven as follows. Light in an illuminated area that faces the light-emitting surface of the blue LED chip 202 is more bluish, and light in an illuminated area that obliquely faces the light-emitting surface is more yellowish.

With the use of the phosphor plate 204 according to Patent Citation 1, phosphor particles embedded in the synthetic resin functions as a scattering agent. As a result, colors of the blue light and the yellow light are moderately mixed within the phosphor plate so that the color unevenness in the illuminated area is reduced to some extent.

However, according to the phosphor plate in accordance with Patent Citations 2 and 3, since such a scattering function as above is hardly performed, the color is uneven particularly in the illuminated area.

To solve the above problem, it is proposed to keep a long distance between the blue LED chip and the phosphor plate, and reduce a difference between incident angles of the blue light in the central and in the periphery of a light-incident surface of the phosphor plate. However, since the package may grow in size, such proposal is unfavorable.

In view of the above problem, it is an object of the present invention to provide a semiconductor light-emitting apparatus that effectively reduces color unevenness in the illuminated area without causing the package to grow in size.

Means to Solve the Problem

To achieve the object, one aspect of the present invention provides a semiconductor light-emitting apparatus including a semiconductor light-emitting device operable to emit primary light having a peak wavelength in a visible region, and a wavelength converter operable to (a) convert a portion of the primary light into secondary light having a longer peak wavelength in the visible region than the peak wavelength and (b) emit the secondary light in combination with a remainder of the primary light left unconverted, wherein the wavelength converter includes a main body that extends across a path of light emitted from the semiconductor light-emitting device; and a light-emitting part composed of a plurality of columnar protrusions formed on a part of the main body located in a direction in which the light exits.

Furthermore, a tip diameter of each protrusion ranges from 1 [micrometer] to 100 [micrometer], inclusive, and a length of each protrusion ranges from 3 to 20 times the tip diameter, inclusive. Furthermore, a tip diameter of each protrusion ranges from 3 [micrometer] to 30 [micrometer], inclusive. Furthermore, a tip diameter of each protrusion ranges from 5 [micrometer] to 10 [micrometer], inclusive.

Furthermore, a length of each protrusion ranges from 5 to 10 times a tip diameter of the protrusion, inclusive.

A space between each two adjacent protrusions ranges from 1 [micrometer] to 10 [micrometer], inclusive. In addition, a space between each two adjacent protrusions ranges from 3 [micrometer] to 8 [micrometer], inclusive.

The wavelength converter is made any one of a ceramic material, a composite glass material, a crystallized glass material, and an oxide single-crystal material.

A light-emitting surface of the semiconductor light-emitting device is in absolute contact with a light-incident surface of the wavelength converter.

Effects of the Invention

According to the semiconductor light-emitting apparatus having the above structure, in each of the protrusions that compose the light-emitting part, the primary light and the secondary light incident from a base end of each protrusion are repeatedly reflected within the protrusion so that the wavelength thereof are guided, and subsequently the light exits from the top end of each protrusion. As a result, the primary light and the secondary light are radially emitted from the top end. Accordingly, if a ratio between the primary light and the secondary light differs at each protrusion, the primary and the secondary light emitted from the protrusions are mixed in the illuminated area. Thus, the color unevenness in the illuminated area is reduced.

BRIEF DESCRIPTION OF THE DRAWINGS

FIG. 1A is a plan view showing a surface-mount LED package in accordance with Embodiment 1 of the present invention.

FIG. 1B is a cross section view taken along line A-A of FIG. 1A.

FIG. 2A is a plan view of a phosphor plate.

FIG. 2B is a view showing a detail of B part of FIG. 1B.

FIG. 3A is a view showing a function of light waveguide parts.

FIG. 3B is a view showing a size of the light waveguide parts.

FIG. 4 is a view showing an effect of reducing color unevenness with regard to the surface-mount LED package.

FIG. 5 is a cross section view schematically showing a surface-mount LED package in accordance with Embodiment 2 of the present invention.

FIG. 6 is a cross section view schematically showing a surface-mount LED package in accordance with Embodiment 3 of the present invention.

FIG. 7 is a cross section view schematically showing a surface-mount LED package in accordance with Embodiment 4 of the present invention.

FIG. 8B is a cross section view schematically showing a surface-mount LED package in accordance with a modification of Embodiment 5 of the present invention.

FIG. 9 is a cross section view schematically showing a white LED of a surface-mount LED package in accordance with Embodiment 6 of the present invention.

FIG. 10A is a view showing a modification of the light waveguide parts.

FIG. 10B is a view showing another modification of the light waveguide parts.

FIG. 10C is a view showing yet another modification of the light waveguide parts.

FIG. 10D is a view showing yet another modification of the light waveguide parts.

FIG. 10E is a view showing yet another modification of the light waveguide parts.

FIG. 10F is a view showing yet another modification of the light waveguide parts.

FIG. 10G is a view showing yet another modification of the light waveguide parts.

FIG. 10H is a view showing yet another modification of the light waveguide parts.

FIG. 11 is a view showing a prior art.

DESCRIPTION OF THE CHARACTERS 2, 50, 80, 100, 101, 120 surface-mount white LED package
18, 126 blue LED
30, 54, 82, 92, 112, 119, 124 phosphor plate
42 light-emitting part
39, 111, 117 main body
44, 94, 96, 118, 140, 150, 152, 154, 156, 158, 160, 162 light waveguide parts

BEST MODE FOR CARRYING OUT THE INVENTION

The following describes an embodiment of a semiconductor light-emitting apparatus in accordance with the present invention with reference to the drawings.

Embodiment 1

FIG. 1 schematically shows a surface-mount white LED package 2 (hereinafter, simply referred to as "LED package 2") as an embodiment of the semiconductor light-emitting apparatus in accordance with the present invention. FIG. 1A is a plan view of the LED package 2. FIG. 1B is a cross section view taken along line A-A of FIG. 1A. Note that scales of constituents in all the drawings including FIG. 1 are not unified.

The LED package 2 has a printed-wiring board 6 composed of the insulating substrate 4 on which a wiring pattern (unshown in FIG. 1) is printed. The insulating substrate 4 is made of aluminum nitride (AlN) and is a base on which the semi-conductor light-emitting device is mounted. The size of the insulating substrate 4 is 30 [millimeter]*50 [millimeter]*1.5 [millimeter] which are respectively length*width*thickness.

On the printed-wiring board 6, a plurality of white LEDs 8 (five in this embodiment) are arranged. These white LEDs 8 are connected in series via the wiring pattern. A p-side electrode of the white LED 8 which is a high-potential terminal in the series is electrically connected to an anode terminal 10 via a portion of the wiring pattern. An n-side electrode of the white LED 8 which is a low-potential terminal is connected to a cathode terminal 12 via a portion of the wiring pattern.

Each white LED 8 is covered with a hemispheroidal glass cover 14.

FIG. 2B shows a detail of B part in FIG. 1B. FIG. 2A is a plan view of a phosphor plate 30 that is described later.

As shown in FIG. 2B, the wiring pattern 16 made of Ti/Pt/Au formed on the insulating substrate 4 is bonded to the GaN-base blue LED 18 which is a semiconductor light-emitting device with an eutectic bonding layer (unshown) made of AuSn therebetween.

The blue LED 18 is composed of a p-side electrode (unshown) made of an Ag/Pt/Au film, a p-GaN-base semiconductor layer 20, an InGaN-base quantum well light-emitting layer 22, an n-GaN-base semiconductor layer 24, and an n-side electrode 26 made of a Ti/Pt/Au film, layered on the insulating substrate 4 in the stated order. The p-GaN-base semiconductor layer 20 is 200 [nanometer] thick. The n-GaN-base semi-conductor layer 24 is 6 [micrometer] thick. The blue LED 18 is 1 millimeter per side in a plan view. The n-side electrode 26 is in a frame-like shape fitting against a peripheral boarder of the n-GaN-base semiconductor layer 24. Note that the p-GaN-base semi-conductor layer 20, the light-emitting layer 22, and the n-GaN-base semiconductor layer 24 are formed by being epitaxially grown on an unshown sapphire substrate and separated therefrom.

The light-emitting layer 22 emits blue light having a peak wavelength of 440-470 [nanometer] in a visible region. Herein, the visible region is defined by wavelengths ranging between 380-780 [nanometer], inclusive. To enhance the efficiency of extracting light from the blue LED 18, an upper surface (light-emitting surface) of the n-GaN-base semiconductor layer 24 is formed as a corrugated surface with a thickness of micrometers by being illuminated in KOH solution.

On each lateral surface of the blue LED 18, an inorganic insulating film 28 made of silicon nitride is formed.

The phosphor plate 30 which is a wavelength converter is arranged being opposed to the insulating substrate 4 and extending across the light-emission path of the blue LED 14. The phosphor plate 30 is made of YAG ceramics doped with cerium (Ce). A refractive index of the phosphor plate 30 is 1.83. A lower surface (light-incident surface) of the phosphor plate 30 is sandblasted to be a corrugated surface with a thickness of some micrometers.

If a space between the phosphor plate 30 and the blue LED 18 is hollow as shown in the embodiment, more blue light can be incident upon the phosphor plate 30 when, described as above, the lower surface of the phosphor plate 30 and the light-emitting surface of the blue LED 18 that oppose each other are corrugated. Consequently, a difference between refractive indexes thereof the phosphor plate 30 and the blue LED 18 can suppress the reflection in a surface boundary thereof, and more blue light can be incident upon the phosphor plate 30.

Note that the thickness of the phosphor plate 30 depends on a concentration of an activator agent, a mechanical strength and an adopted process, and is desirably in a range between 20 [micrometer] and 1 [millimeter], inclusive. An increase in the concentration of the activator agent enables the phosphor plate to be thin so that a smaller and thinner white light source can be realized. A low concentration of the activator agent enables the phosphor plate to be thick, which advantageously suppresses the variation of the light color and increases the mechanical strength. As shown in this embodiment or later-described Embodiment 6, when the phosphor plate 30 is fixed as if supported by the blue LED 18, a thin phosphor plate whose thickness ranging between 20 [micrometer] and 200 [micrometer], inclusive, is applicable. In Embodiments 2-5 in which a phosphor plate is mounted on the base, a thick phosphor plate whose thickness ranging between 300 [micrometer] and 1 [millimeter], inclusive, is applicable.

When the phosphor plate is made of a base material, such as a resin or glass, in which phosphor particles are dispersed, since light is scattered in the surface boundary due to a difference between the refractive indexes of the phosphor particles and the base material, the primary light and the secondary light are mixed together. On the other hand, according to the aforementioned wavelength converter made of ceramics and the like, although the light scattering or the like occurs, compared with the phosphor plate made of the resin having the phosphor particles dispersed therein, the scattering effect is weaker. In general, since a thin phosphor plate has a short optical path, the scattering effect tends to be reduced. Accordingly, the thickness of the phosphor plate is favorably between 20-200 micrometers, or more favorably 100 micrometers or less to produce the effect pertaining to the present invention.

In addition, a metallic connection layer 32 made of a Cr/Pt/Au film is formed in a frame-like shape fitting against the peripheral boarder of the lower surface of the phosphor plate 30.

The metallic connection layer 32 and the n-side electrode 26 are connected with each other via a plurality of Au bumps 34. The metallic connection layer 32 and the wiring pattern 36 made of Ti/Pt/Au are connected with each other via a plurality of Au bumps 38.

In the above structure, when electricity is supplied via the wiring patterns 16 and 36, the blue LED 18 emits blue light as the primary light. The blue light emitted from the blue LED 18 is incident upon a lower surface (light-incident surface 40) of the main body 39 of the phosphor plate 30. The phosphor plate 30 converts a portion of the blue light incident from the blue LED 18 into yellow light as the secondary light having a longer peak wavelength in the visible region than that of the primary light. A light-emitting part 42 of the wavelength converter emits the yellow light in combination with a remainder of blue light whose wavelength left unconverted.

The light-emitting part 42 of the phosphor plate 30 has light waveguide parts 44 made of a plurality of columnar protrusions (each shown in a cylindrical shape in the drawing) formed on a part of the square plate-like main body 39 to which the light exits.

As shown in FIG. 2A, the light waveguide parts 44 are arranged in a matrix.

The following describes a function of the light waveguide parts 44 with reference to FIG. 3A. FIG. 3A is an enlarged cross section view of the light waveguide parts 44.

After light incident obliquely relative to a central axis C of each light waveguide part 44 is repeatedly reflected in the surface boundary between the light waveguide part 44 and an air space, thereby guiding the wavelength, the light is emitted from a top end surface 46 of the light-emitting part. As a result, the top end surface 46 radially emits the light.

The radial emission of the light from the top end surface 46 of each light waveguide part 44 reduces the color unevenness in the illuminated area. This is described in detail with reference to FIG. 4.

FIG. 4 is a schematic diagram solely showing the blue LED 18 and the phosphor plate 30 in the LED package 2.

A portion of blue light incident upon the light-incident surface 40 of the phosphor plate 30 from the blue LED 18 is converted into yellow light by the wavelength conversion. The yellow light and a remainder of the blue light left unconverted are branched (divided) and incident upon each light waveguide part 44.

Out of light incident upon the light waveguide parts 44 arranged in a matrix, light incident upon the light waveguide part 44A closer to the center of the phosphor plate 30 is more bluish. On the contrary, light incident upon the light waveguide part 44B closer to the periphery of the phosphor plate 30 is more yellowish. This phenomenon occurs due to the similar reason described in [Problems Solved by the Invention].

Thus, the top end surface of the light waveguide part 44A emits bluish light, and the top end surface of the light waveguide part 44B emits yellowish light. (In FIG. 4, the bluish light is represented by a solid line, and the yellowish light is represented by a dash line.)

However, as described above, light emitted from the top end surface of each light waveguide part 44 extends radially. As a result, in the illuminated area, the bluish light and the yellowish light are adequately mixed to produce white light. Thus, light of less variable color than before is illuminated in the illuminated area.

At this time, to reduce the color unevenness, when each light waveguide part 44 is regarded as an independent light source, it is desirable that a light distribution curve of each light source (each light waveguide part 44) is uniform.

For this purpose, light should reflect more in the surface boundary of each light waveguide part 44. To do so, each light waveguide part 44 should be as thin as possible.

The following describes a favorable shape of each light waveguide part 44 with reference to FIG. 3B.

(1) Tip Diameter D

Described as above, each light waveguide part 44 is desirably as thin as possible. However, if the light waveguide part 44 is excessively thin, light can be easily diffracted behind the top end surface 46 of each light waveguide part 44. This additionally causes the color unevenness. In response, in view of the wavelength region of the visible light that is 380-780 [nanometer], a diameter D of a tip (top end surface 46) of each light waveguide part 44 is desirably 1 [micrometer] or more. Furthermore, when light with a long wavelength is emitted, the tip diameter D is desirably 3 [micrometer] or more. In addition, when visible light with the longest wavelength of 780 [nanometer] is emitted, the tip diameter D is desirably 5 [micrometer] or more.

On the other hand, if the tip diameter D is excessively large, the light waveguide parts 44 are not very effective. From this point of view, the tip diameter D is desirably 100 [micrometer] or less and more desirably 30 [micrometer] or less, even more desirably 10 [micrometer] or less.

In view of the above-mentioned combination of the above-mentioned smallest permissible diameter and largest permissible diameter, the following tip diameter D is desirable.

The tip diameter D desirably ranges between 1 [micrometer] and 100 [micrometer], inclusive, more desirably between 3 [micrometer] and 30 [micrometer], inclusive, and even more desirably between 5 [micrometer] and 10-[micrometer], inclusive.

(2) Ratio of Tip Diameter D to Height (Length) H

Furthermore, to increase the number of light reflections in the light waveguide parts 44, and to make the light distribution curve uniform between the light waveguide parts 44, each light waveguide part 44 should be slender. The degree of the slenderness can be represented by a ratio of the height (length) H to the tip diameter D.

When the ratio of the height H to the tip diameter D is excessively small (excessively thick and short), undesirably, the number of the light reflections is reduced. On the other hand, when the ratio of the height H to the tip diameter D is excessively large (excessively thin and long), undesirably, it becomes difficult to manufacture the light waveguide parts 44, because the light waveguide parts 44 are manufactured by etching away other part than the protrusions with the use of an etching technique.

Therefore, with regard to the relation between the height H and the tip diameter D, the height H desirably ranges from 3 to 20 times the length of the tip diameter D, inclusive, and more desirably 5 to 10 times the length, inclusive.

(3) Space Between Light Waveguide Parts

It is desirable that a multitude of the light waveguide parts 44 are minimally spaced. However, when a space therebetween is excessively small, unfortunately, an evanescent wave is transmitted to the adjacent light waveguide part 44. On the other hand, when the space therebetween is excessively large, undesirably, only a small number of the light waveguide parts 44 can be arranged in a limited area of the main body 39.

From the above viewpoint, a space P between each two adjacent light waveguide parts 44 desirably ranges between 1 [micrometer] and 10 [micrometer], inclusive, and more desirably between 3 [micrometer] and 8 [micrometer], inclusive. Here, the space P is a shortest distance between lateral surfaces of the two adjacent light waveguide parts 44.

According to this embodiment, all constituents can be made of inorganic materials, which improves heat resistance. Therefore, a high-power semiconductor light-emitting apparatus applicable to a general illuminating light source can be realized.

The advantage in using a ceramics phosphor in the wavelength converter instead of the generally-used phosphor material dispersed in the resin material is high thermal conductivity of the ceramics phosphor. The thermal conductivity of the YAG ceramics used in this embodiment is 10 W/mK or more, which is increased by approximately single to double digits compared to the resin material. Heat generated in the phosphor plate 30 due to the Stokes loss can be effectively dissipated via the closely-placed blue LED 18 and an AlN insulating substrate 4 made of a high-thermal conductive material. Thus, temperature rise of the phosphor plate 30 can be suppressed, and thus high conversion efficiency can be maintained.

In the space between the phosphor plate 30 and the blue LED 18, a translucent material, such as a glass material, an oxide material, a nitride material, a carbide material, a phosphor material, a resin material, a particulate material of these, and a combined material of these can be filled. When a particulate material having an appropriate particle diameter is filled therein, because of the scattering effect, blue light can be uniformly illuminated on the lower surface of the phosphor plate 30. In addition, when the phosphor material is filled therein, a light color component other than yellow light generated by the phosphor plate can be added.

The effect of filling the above mentioned material in the space is as follows. Compared with when the space is hollow, heat generated in the phosphor plate 30 due to the Stokes loss is likely to be dissipated toward the blue LED 18, which can prevent the decrease in conversion efficiency of the phosphor plate due to the temperature rise.

The filling material, the particle diameter, and a combination of these can control a refractive index of the filling material so that blue light can be incident upon the phosphor plate 30 with a small loss.

In addition, the multilayer film having wavelength selection characteristics and made of an oxide material or the like is formed on the light-emitting surface of the blue LED 18 and the light-incident surface of the phosphor plate 30, with the use of sputtering techniques or the like. As a consequence, the blue light can be selectively transmitted, and the yellow light can be selectively reflected, which can suppress loss caused by returning of yellow light generated at the phosphor plate 30 to the blue LED 18.

The glass material includes optical glass as well as glass material manufactured by sol-gel method or the like.

$SiO_2$, $Al_2O_3$, ZnO, $Y_2O_3$, $TiO_2$, $ZrO_2$, $HfO_2$, $SnO_2$, $Ta_2O_3$, $Nb_2O_5$, $BaSO_4$, ZnS, or $V_2O_5$ is one example of the oxide. AlN, BN, or AlN is one example of the nitride. SiC or C is one example of the carbide.

An example of the resin material that has high translucency, high heat resistance, and high light resistance is a silicon resin, a polyimide resin, fluorine series resin, and a resin material including these.

An example of each phosphor material is as follows.

As a yellow phosphor, $Y_3Al_5O_{12}:Ce^{3+}$, $Y_3(Al, Ga)_5O_{12}:Ce^{3+}$, $(Y, Gd)\ 3Al_5O_{12}:Ce^{3+}$, $Y_3Al_5O_{12}:Tb^{3+}$, $Y_3Al_5O_{12}:Ce^{3+}, Pr^{3+}$, a thiogallate phosphor, such as $CaGa_2S_4:Eu^{2+}$, an alpha-SiAlON phosphor, such as Ca-alpha-SiAlON:$Eu^{2+}$ or the like is used.

As a green phosphor, an aluminate phosphor, such as $BaMgAl_{10}O_{17}:Eu^{2+}$, $Mn^{2+}$, (Ba, Sr, Ca) $Al_2O_4:Eu^{2+}$, an alpha-SiAlON phosphor, such as $Sr1.5Al_3Si_9N_{16}:Eu^{2+}$, Ca-alpha-SiAlON:$Yb^{2+}$, a beta-SiAlON phosphor, such as beta-$Si_3N4:Eu^{2+}$, an oxide phosphor, such as silicate (Ba, Sr) $2SiO_4:Eu^{2+}$, an oxynitride phosphor, such as oxynitride silicate (Ba, Sr, Ca) $Si_2O_2N_2:Eu^{2+}$, oxynitride aluminosilicate (Ba, Sr, Ca) $2Si_4AlON_7:Ce^{3+}$, (Ba, Sr, Ca) $Al_2$-$xSixO_4$-xNx:$Eu^{2+}$ (0<x<2), a nitride phosphor, a nitride silicate phosphor, such as (Ba, Sr, Ca) $2Si_5N_8:Ce^{3+}$, a thiogallate phosphor, such as $SrGa_2S_4:Eu^{2+}$, a garnet phosphor, such as $Ca_3Sc_2Si_3O_{12}:Ce^{3+}$, $BaY_2SiAl_4O_{12}:Ce^{3+}$ or the like are used.

As an orange phosphor, an alpha-SiAlON phosphor, such as Ca-alpha-SiAlON:$Eu^{2+}$ or the like is used As a red phosphor, a sulfide phosphor, such as (Ca,Sr)$AlSiN_3:Eu^{2+}$, (Sr, Ca) S:$Eu^{2+}$, $La_2O_2S:Eu^{3+}$, $Sm^{3+}$, a silicate phosphor, such as $Ba_3MgSi_2O_8:Eu^{2+}$, $Mn^{2+}$, a nitride or oxynitride phosphor, such as (Ca, Sr) SiN$_2$:Eu$^{2+}$, (Ca, Sr) AlSiN$_3$:Eu$^{2+}$, Sr$_2$Si$_5$-xAl$_x$O$_x$N$_8$-x:Eu$^{2+}$ (0<=x<=1), or the like is used.

These phosphor materials can be used as the particulate material or the phosphor ceramic material.

Embodiment 2

FIG. 5 is a cross section view schematically showing a surface-mount white LED package 50 (hereinafter, simply referred to as "LED package 50") in accordance with Embodiment 2 of the present invention.

The LED package 50 is different from the LED package 2 (FIG. 1) of Embodiment 1, and is composed of one blue LED 52. The phosphor plate 54 of the LED package 50 is made of the same material as the phosphor plate 30 of Embodiment 1. The shape and the like of each light waveguide part 44 are determined from the similar viewpoint, and thus descriptions thereof are omitted here.

The blue LED 52 is a chip-shaped LED with the pair of p-side and n-side electrodes facing up, and is mounted on the insulating substrate 56. The p-side electrode (unshown) of the blue LED 52 and the anode terminal 58 formed on the insulating substrate 56 are connected with each other via the bonding wire 60. On the other hand, the n-side electrode (unshown) and the cathode terminal 62 formed on the insulating substrate 56 are connected with each other via the bonding wire 64.

On the insulating substrate 56, a frame-shaped spacer 66 made of a high-thermal conductivity material is layered. In addition, on an upper surface of the spacer 66, the phosphor plate 54 is mounted. The insulating substrate 56, the phosphor plate 54 and the spacer 66 are fixed together with the use of a heat-resistant adhesive or the like.

The insulating substrate 56 and the spacer 66 that are bases on which the blue LED 52 and the phosphor plate 54 are mounted, respectively, are made of a high-thermal conductive material, such as a metal material, e.g. Cu, Al, Fe, Au and etc., an alloy material of these, a ceramic material e.g. Al$_2$O$_3$, MgO, Y$_2$O$_3$, ZnO, BN, AlN, SiC and etc., and a mixed material of these. When the base is made of a high-thermal conductive material, heat generated by the phosphor plate and the blue LED can be dissipated and thus, the temperature rise can be suppressed.

Embodiment 3

FIG. 6 is a cross section view schematically showing a surface-mount white LED package 80 (hereinafter, simply referred to as "LED package 80") in accordance with Embodiment 3 of the present invention.

The LED package 80 has a structure basically identical with the LED package 50 (FIG. 5) of Embodiment 2 except for the overall shape of the phosphor plate. Therefore, in FIG. 6, constituents of the LED package 80 common to those of the LED package 50 have the identical reference numbers, and descriptions thereof are omitted.

The phosphor plate 82 of the LED package 80 is generally dome-shaped (half-sphere). Because of this shape, the LED package 80 can obtain a wider light distribution curve than that of the LED package 50.

Embodiment 4

FIG. 7 is a cross section view showing an outline structure of a surface-mount LED package 90 (hereinafter, simply referred to as "LED package 90") in accordance with Embodiment 4.

The LED package 90 has a structure basically identical with the LED package 50 (FIG. 5) of Embodiment 2 except for the structure of the light waveguide part in the phosphor plate. Therefore, in FIG. 7, constituents of the LED package 90 that are common to those of the LED package 50 have identical reference numbers, and descriptions thereof are omitted.

In the LED package 50 (FIG. 5), all the light waveguide parts have the same shape and size. In contrast, according to the phosphor plate 92 of the LED package 90, a combination of the light waveguide parts 94 and 96 that have different heights (lengths) and tip diameters is used.

This structure can suppress generation of interference patterns.

Note that since it is difficult to manufacture such light waveguide parts 94 and 96 by applying etching to a base material, in this embodiment, each light waveguide part is manufactured by joining separately-produced member to a square plate-like main body 98 with the use of an adhesive. Note that, in this case, the light waveguide parts 94 and 96 and the main body 98 may be made of different materials. For example, the following combinations can be made. The main body 98 is made of an identical material with the phosphor plate 30 of Embodiment 1, and the light waveguide parts 94 and 96 are made of low melting glass.

Embodiment 5

FIG. 8A is a cross section view schematically showing a surface-mount LED package 100 (hereinafter, simply referred to as "LED package 100") of Embodiment 5.

The LED package 100 is different from the LED package 50 (FIG. 5) of Embodiment 2, and is made of a plurality of (two in this embodiment) blue LEDs 52A and 52B. Each of the blue LEDs 52A and 52B is identical with the blue LED 52 of Embodiment 2.

The p-side electrode (unshown) of the blue LED 52A and the anode terminal 104 formed on the insulating substrate 102 are connected with each other via a bonding wire 60A. The n-side electrode (unshown) and a pad 106 formed on the insulating substrate 58 are connected with each other via a bonding wire 64A.

On the other hand, the p-side electrode (unshown) of the blue LED 52B and the pad 106 are connected with each other via a bonding wire 60B. The n-side electrode (unshown) and the cathode terminal 108 formed on the insulating substrate 58 are connected with each other by a bonding wire 64B.

With the above structure, the blue LEDs 52A and 52B are connected in series.

On the insulating substrate 102, a frame-shaped spacer 110 made of an insulating material is layered. In addition, on an upper surface of the spacer 110, the phosphor plate 112 is mounted.

The phosphor plate 112 includes a main body 111 composed of two different phosphor plates 114 and 116 and a plurality of light waveguide parts 118.

The phosphor plate 114 performs wavelength conversion of blue light emitted from the blue LEDs 52A and 52B into red light.

The phosphor plate 116 performs wavelength conversion of blue light emitted from the blue LEDs 52A and 52B into green light.

Each light waveguide part 118 is made of a cylindrical member whose top end surface is hemispheroidal, and is made of low melting glass, for example. Each light waveguide part 118 does not always need to contain a phosphor.

The insulating substrate 102, the phosphor plates 114 and 116, and the light waveguide parts 118 are fixed with the use of an adhesive. The insulating substrate 56, the phosphor plate 54 and the spacer 66 are fixed with the use of the heat-resistant adhesive or the like.

According to the LED package 100 having the above structure, blue light emitted from the blue LEDs 52A and 52B is converted into red light at the phosphor plate 114, and into green light at the phosphor plate 116. Subsequently, blue light remained unconverted into green light or red light is mixed with the red light and the green light to produce white light.

Thus, when a phosphor plate is composed of the phosphor plates emitting different colors of light, the white color can have various light colors having different color temperatures and the like.

In addition, when a shape of the top end surface of each light waveguide part is hemispheroidal, the efficiency of extracting light from each light waveguide part is improved.

FIG. 8B is a cross section view schematically showing a surface-mount LED package 101 (hereinafter, simply referred to as "LED package 101") in accordance with a modification of Embodiment 5.

The LED package 101 is basically identical with the LED package 100 except for the structure of the main body of the phosphor plate. Therefore, in FIG. 8B, constituents of the LED package 101 common to those of the LED package 100 have the identical reference numbers, and differences thereof are mainly described.

The main body 111 of the package 100 (FIG. 8A) is composed of two different phosphor plates layered orthogonally on the main surface of the insulating substrate 102. On the other hand, according to the phosphor plate 119 of the LED package 101, a main body 117 is composed of two different phosphor plates 113 and 115 in a strip shape and alternately arranged in parallel with the main surface of the insulating substrate 102. Thus, seen from a direction orthogonal to the insulating substrate 102, the main body 117 is striped with the phosphor plates 113 and 115 alternately arranged. The phosphor plate 113 converts the blue light emitted from the blue LED's 52A and 52B into red light. The phosphor plate 115 converts the blue light emitted from the blue LED's 52A and 52B into green light.

According to the LED package 101, the mechanism of obtaining white light is basically identical with that of the LED package 100. Therefore, a description thereof is omitted here.

Note that the phosphor emitting red light absorbs light emitted from the phosphor emitting green light whose wavelength is shorter than that of the red light, and that the absorbed light results in a loss.

Accordingly, as with the main body 111 shown in FIG. 8A and the main body 117 shown in FIG. 8B, by arranging both of the phosphor plates, the green light is prevented from transmitting the phosphor emitting red light so that the above loss can be reduced.

From this viewpoint, in the main body 117 shown in FIG. 8B, by forming at least a reflection layer that reflects green light between the phosphor plates 113 and 115, the above loss can be reduced.

Note that in addition to the above modification, the main body of the phosphor plate may be formed as follows. A phosphor column that is in a rectangular columnar shape and that emits red light and a phosphor column that is in a rectangular columnar shape and that emits green light are arranged checkerwise such that the main body appears checked, seen from a direction vertical to the main surface of the insulating substrate 102. In such a case, note that a cross-section of the main body appears similarly to that shown in FIG. 8B.

Embodiment 6

FIG. 9 is a cross section view showing an outline structure of a white LED 122 and a vicinity thereof in the surface-mount white LED package 120 (hereinafter, simply referred to as "LED package 120") in accordance with Embodiment 6.

The LED package 120 includes the white LED 122 instead of the white LED 8 used in the LED package 2 in accordance with Embodiment 1 (FIGS. 1 and 2). The LED package 120 is basically identical with the LED package 2 except for the structure of the white LED.

While in the white LED 8 (FIG. 2), the phosphor plate 30 is arranged in spaced relation to the blue LED 18, in the white LED 122, the phosphor plate 124 is in contact with the blue LED 126.

The blue LED 126 has a semiconductor multilayer film structure having a p-GaN-base semiconductor layer 128, an InGaN-base quantum well emitting layer 130, and an n-GaN-base semiconductor layer 132, layered on the insulating substrate 4 in the stated order.

On the lower surface of the p-GaN-base semiconductor layer 128, a p-side electrode 134 is formed. On an exposed portion of the n-GaN-base semiconductor layer 132, an n-side electrode 136 is formed.

On lateral surfaces of the semiconductor multilayer film, an insulating film 138 made of nitride silicon is formed.

The p-GaN-base semiconductor layer 128 is 200 [nanometer] thick, and the n-GaN-base semiconductor layer 132 is 6 [micrometer] thick. The blue LED 126 in a plan view is 1 millimeter per side. Note that a GaN-base multilayer made of the p-GaN-base semiconductor layer 128, the light-emitting layer 130, and the n-GaN-base semiconductor layer 132 is epitaxially grown and is formed on an unshown YAG substrate with a buffer layer (unshown) therebetween. Note that the phosphor plate 124 has the light waveguide parts 140 each etched in a columnar shape on a side of the phosphor plate 124 opposite to the blue LED 126 of the YAG substrate.

The p-side electrode 134 and the n-side electrode 136 are connected respectively, via gold (Au) bumps 142 and 146, to the wiring pattern 144 and 148 formed on the insulating substrate 4.

When electricity is supplied to the blue LED 126 via the wiring patterns 144 and 148, the light-emitting layer 130 emits blue light having the same spectrum with that emitted from the blue LED 18 (FIG. 2) of Embodiment 1.

The phosphor plate 124 has a structure and a material basically identical with the phosphor plate 30 of Embodiment 1 except that the incident angle of the blue light is flat.

However, since a light-incident surface (lower surface) of the phosphor plate 124 and the light-emitting surface (upper surface of the n-GaN-base conductive layer 132) of the blue LED 126 are in contact with each other, as with Embodiment 1, decrease in conversion efficiency of the phosphor plate 124 due to the temperature rise can be prevented.

In addition, in the white LED 122 of this embodiment, the blue LED 126 and the phosphor plate 124 can be considered as one integrally-formed device. Accordingly, the present invention is advantageous in productivity, and downsizing and slimming-down of the product.

Thus, the present invention is described based on the embodiments. However the present invention is never limited to the above embodiments and is applicable to the following embodiments as well.

(1) The host material of the phosphor plate of the embodiments is YAG ceramics, and the phosphor plate is made of phosphor ceramics doped with Ce. However, the phosphor plate is not limited to this, and the phosphor plate can be made of the following materials.

In addition to the above phosphor material, such as a ceramic material of $Y_3Al_5O_{12}:Ce^{3+}$ and the like sintered into a plate-like shape, the phosphor plate may be made of a solution-grown composite ceramic material or the like. This ceramic material is made of single crystals of $Al_2O_3$ and $Y_3Al_5O_{12}$ with $Ce^{3+}$ that are continuously and three-dimensionally entwined with each other, with the single crystals being maintained, and does not have an amorphous layer in a surface boarder thereof.

In addition, the phosphor plate is made of a composite glass material as follows. The mixture of glass powder of any one of $SiO_2$—$B_2O_3$-based glass, $SiO_2$—RO (RO represents MgO, CaO, SrO, and BaO)-based glass, $SiO_2$—$B_2O_3$—$R_2O$ ($R_2O$ represents $Li_2O$, $Na_2O$, and $K_2O$)-based glass, $SiO_2$—$B_2O_3$—$Al_2O_3$-based glass, $SiO_2$—$B_2O_3$—ZnO-based glass, and ZnO—$B_2O_3$-based glass and the phosphor materials are sintered together. Consequently, the phosphor materials are dispersed in the glass. For example, to burn the composite glass material at a low temperature, ZnO—$B_2O_3$-based glass, SnO—$P_2O_5$-based glass whose softening points can be relatively easily lowered should be selected. To improve weatherability of the composite glass material, $SiO_2$—$B_2O_3$-based glass, $SiO_2$—RO-based glass, $SiO_2$—$B_2O_3$—$R_{2O}$-based glass, $SiO_2$—$B_2O_3$—$Al_2O_3$-based glass, and $SiO_2$—$B_2O_3$—ZnO-based glass should be selected.

Furthermore, the phosphor plate may be made of crystallized glass material obtained by separating out $Ce^{3+}$ garnet crystals by melting and cooling a mixed material of $SiO_2$, $Al_2O_3$, $Y_2O_3$, $GeO_2$, $Gd_2O_3$, $Li_2O$, $CaO+MgO+Sc_2O_3$, $Ce_2O_3$ and the like.

In addition, the phosphor plate may be made of the oxide single crystal material of $Y_3 Al_5O_{12}$ single crystals doped with $Ce^{3+}$. The advantage in using the single crystal materials is that, compared with ceramics substrate, the high-quality LED structure can be epitaxially grown on the single crystal substrate, as shown in Embodiment 6.

(2) In the embodiments, a combination of the blue LED and the yellow phosphor, or a combination of the blue LED and the green phosphor or the red phosphor enables the LED package to emit white light. That is to say, the embodiments show an example that the primary light of the blue light and the secondary light of the yellow light which is complementary color thereof synthesize white light. This is because, as a light source for illumination, it is desirable to synthesize white light on the blackbody locus shown on the chromaticity coordinates.

However, the primary light, secondary light and synthetic light are not limited to these colors. The white light can be produced by combining with another light color. Also, other color than the white can be produced. In such a case, light color in a wide range of chromaticity coordinates can be produced, and usable as a light source for display.

(3) In the above embodiments, as shown in FIG. 10A, the cylindrical light waveguide parts 44 are spacedly arranged in a matrix in a plan view. However, the arrangement of the light waveguide parts is not limited to this. For example, light waveguide parts 150 and 152 may be arranged as shown in FIGS. 10B and 10C.

In addition, the light waveguide parts do not have to be cylindrical. The square-pillar shaped light waveguide parts 154 and 156 as shown in FIGS. 10D and 10E, or triangular-pillar shaped light waveguide parts 158 and 160 as shown in FIGS. 10F and 10G is applicable. Alternatively, the hexagonal-pillar shaped light waveguide part 162 as shown in FIG. 10H is applicable.

When the light waveguide parts are continuous as shown in FIGS. 10E and 10F, spaces walled by outer walls of the light waveguide part (partitioned) are formed. After light leaked from the light waveguide part is repeatedly reflected in the space and waves thereof are guided, the light is emitted from an opening of the space. Accordingly, the spaces walled by the outer walls produce the same effect as the light waveguide part.

(4) The top end surface of the light waveguide part does not need to be flat (FIGS. 2, 5, 6, 7, and 9) or hemispheroidal (FIG. 8), and can be conical, for example. Thanks to the conical top end surface, an even wider light distribution curve can be realized in each light waveguide part. As a result, the color unevenness in the illuminated area can further be suppressed.

INDUSTRIAL APPLICABILITY

The semiconductor light-emitting apparatus in accordance with the present invention is favorably applicable to a light source of various type of lighting fixtures mounted on a vehicle (headlight, fog lamp, instrument panel back light, courtesy light and etc.) and a light source of a flashbulb of a camera, a backlight unit for a liquid crystal display monitor.

The invention claimed is:

1. A semiconductor light-emitting apparatus comprising:
   a semiconductor light-emitting device operable to emit primary light having a peak wavelength in a visible region; and
   a wavelength converter operable to (a) convert a portion of the primary light into secondary light having a longer peak wavelength in the visible region than the peak wavelength and (b) emit the secondary light in combination with a remainder of the primary light left unconverted,
   wherein the wavelength converter includes: a main body that extends across a path of light emitted from the semiconductor light-emitting device; and a plurality of light waveguide parts each being a columnar protrusion formed on a part of the main body located in a direction in which the light exits,
   wherein a top end surface of each light waveguide part emits a color mixture of the remainder of the primary light and the secondary light.

2. The semiconductor light-emitting apparatus of claim 1, wherein a tip diameter of each light waveguide part ranges from 1 micrometer to 100 micrometers, inclusive, and a length of each light waveguide part ranges from 3 to 20 times the tip diameter, inclusive.

3. The semiconductor light-emitting apparatus of claim 2, wherein a space between each two adjacent light waveguide parts ranges from 3 micrometers to 8 micrometers, inclusive.

4. The semiconductor light-emitting apparatus of claim 1, wherein a tip diameter of each light waveguide part ranges from 3 micrometers to 30 micrometers, inclusive.

5. The semiconductor light-emitting apparatus of claim 1, wherein a tip diameter of each light waveguide part ranges from 5 micrometers to 10 micrometers, inclusive.

6. The semiconductor light-emitting apparatus of claim 1, wherein a length of each light waveguide part ranges from 5 to    times a tip diameter of the protrusion, inclusive.

7. The semiconductor light-emitting apparatus of claim 1, wherein a space between each two adjacent light waveguide parts ranges from 1 micrometer to 10 micrometers, inclusive.

8. The semiconductor light-emitting apparatus of claim 1, wherein the wavelength converter is made any of one of a ceramic material, a composite glass material, a crystallized glass material, and an oxide single-crystal material.

9. The semiconductor light-emitting apparatus of claim 1, wherein a light-emitting surface of the semiconductor light-emitting device is in absolute contact with a light-incident surface of the wavelength converter.

10. The semiconductor light-emitting apparatus of claim 1, wherein the main body is dome-shaped, and the plurality of light waveguide parts are arranged radially.

11. The semiconductor light-emitting apparatus of claim 1, wherein the plurality of light waveguide parts includes a light waveguide part having a length and a tip diameter that are respectively different from lengths and tip diameters of a remainder of the light waveguide parts.

12. The semiconductor light-emitting apparatus of claim 1, wherein the wavelength converter is composed of at least two types of converters each emitting the secondary light having a different wavelength.

13. The semiconductor light-emitting apparatus of claim 1, wherein the top end surface of each light waveguide part is hemispheroidal or conical.

14. The semiconductor light-emitting apparatus of claim 1, wherein each light waveguide part is cylindrical shaped, square-pillar shaped, triangular-pillar shaped or hexagonal-pillar shaped.

15. A light-emitting device for mounting and enabling power to be provided to a semiconductor light-emitting apparatus of claim 1.

16. A semiconductor light-emitting apparatus comprising:
a semiconductor light-emitting device for emitting a primary light having a peak wavelength in a visible region;
a phosphor containing member extending across the semiconductor light-emitting device, the phosphor is selected to convert a sufficient amount of the emitted primary light to a different secondary wavelength for mixing with a remaining unconverted primary light to provide a color mixture of emitted light; and
a plurality of spaced light waveguide parts extend outward from an upper surface of the phosphor containing member and optically connected with the phosphor containing member to collectively emit the color mixture of emitted light.

17. The semiconductor light-emitting apparatus of claim 16 wherein the phosphor containing member is configured as a plate and the plurality of spaced light waveguide parts are individual columnar protrusions spaced from each other with a width dimension of each light waveguide part being within a range of 1 micrometer to 100 micrometers and length of each light waveguide part from the plate being within a range of 3 to 20 times the width dimension,
wherein the plate has a thickness in the direction of the emitted light within a range of 20 to 200 micrometers and an open air space between adjacent light waveguide parts ranges from 1 micrometer to 10 micrometers.

18. The semiconductor light-emitting apparatus of claim 16, wherein
the phosphor containing member is composed of at least two different types of phosphor, each emitting the secondary light having reflective different wavelengths.

19. The semiconductor light-emitting apparatus of claim 16, wherein
a lower surface of the phosphor containing member is roughened to suppress reflection of the primary light entering the phosphor containing member and the light-emitting surface of the semiconductor light-emitting device is roughened to spread the emitted primary light.

20. A semiconductor light-emitting apparatus comprising:
a semiconductor light-emitting device for emitting a primary light having a peak wavelength in a visible region;
a phosphor containing member extends above and across the semiconductor light-emitting device, the phosphor is selected to convert a sufficient amount of the emitted primary light to a different secondary light wavelength for mixing with a remaining unconverted primary light to provide a color mixture of white emitted light; and
a plurality of air spaced light waveguide parts extend outward from an upper surface of the phosphor containing member and optically connected with the phosphor containing member to collectively emit the color mixture of emitted light, a length of the light waveguide parts are configured to enable multiple internal reflecting of the primary light and the secondary light and a radial dispersment of the emitted light from each of the light waveguide parts.

\* \* \* \* \*